US010636884B2

(12) United States Patent
Tanaka

(10) Patent No.: US 10,636,884 B2
(45) Date of Patent: *Apr. 28, 2020

(54) NITRIDE SEMICONDUCTOR DEVICE

(71) Applicant: ROHM CO., LTD., Kyoto (JP)

(72) Inventor: Taketoshi Tanaka, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/545,455

(22) Filed: Aug. 20, 2019

(65) Prior Publication Data

US 2019/0371897 A1    Dec. 5, 2019

Related U.S. Application Data

(63) Continuation of application No. 16/022,861, filed on Jun. 29, 2018, now Pat. No. 10,388,744, which is a
(Continued)

(30) Foreign Application Priority Data

Aug. 10, 2015    (JP) ................. 2015-158428

(51) Int. Cl.
*H01L 29/417* (2006.01)
*H01L 29/778* (2006.01)
(Continued)

(52) U.S. Cl.
CPC .... *H01L 29/41775* (2013.01); *H01L 29/1054* (2013.01); *H01L 29/2003* (2013.01);
(Continued)

(58) Field of Classification Search
CPC .......... H01L 29/41775; H01L 29/7786; H01L 29/7787; H01L 29/66462; H01L 29/2003;
(Continued)

(56) References Cited

U.S. PATENT DOCUMENTS 7,465,997 B2 * 12/2008 Kinzer ................ H01L 27/0605
257/192
9,166,009 B2    10/2015 Ishikura
(Continued)

FOREIGN PATENT DOCUMENTS

JP    5064824 B2    10/2012

OTHER PUBLICATIONS

JP: Office Action of JP 2015-158428 (related application); dated Sep. 5, 2019; 5 pages.

*Primary Examiner* — Michael M Trinh
(74) *Attorney, Agent, or Firm* — Gregory M. Howison

(57) ABSTRACT

A nitride semiconductor device includes a silicon substrate. A nitride semiconductor layer is formed over the silicon substrate. A gate electrode is formed over the nitride semiconductor layer so as to have a first ring-shaped portion and a second ring-shaped portion connected to the first ring-shaped portion. A first finger electrode is surrounded by the first ring-shaped portion. A second finger electrode is surrounded by the second ring-shaped portion. A third finger electrode is interposed between the first ring-shaped portion and the second ring-shaped portion.

19 Claims, 16 Drawing Sheets

Related U.S. Application Data continuation of application No. 15/232,517, filed on Aug. 9, 2016, now Pat. No. 10,038,064.

(51) Int. Cl.
  *H01L 29/872* (2006.01)
  *H01L 29/20* (2006.01)
  *H01L 29/10* (2006.01)
  *H01L 29/423* (2006.01)
  *H01L 29/66* (2006.01)
  *H01L 29/40* (2006.01)
  *H01L 29/205* (2006.01)

(52) U.S. Cl.
  CPC ......... *H01L 29/205* (2013.01); *H01L 29/402* (2013.01); *H01L 29/4232* (2013.01); *H01L 29/66462* (2013.01); *H01L 29/7786* (2013.01); *H01L 29/7787* (2013.01); *H01L 29/872* (2013.01); *H01L 29/41758* (2013.01); *H01L 29/4238* (2013.01); *H01L 2224/32245* (2013.01); *H01L 2224/48091* (2013.01); *H01L 2224/48247* (2013.01); *H01L 2224/48257* (2013.01); *H01L 2224/73265* (2013.01)

(58) Field of Classification Search
  CPC ............. H01L 29/1054; H01L 29/4232; H01L 29/205; H01L 29/4238; H01L 29/402; H01L 2224/32245; H01L 2224/73265; H01L 2224/48247; H01L 2224/48257
  See application file for complete search history.

(56) References Cited

U.S. PATENT DOCUMENTS

| | | | | |
|---|---|---|---|---|
| 10,038,064 | B2* | 7/2018 | Tanaka | H01L 29/41775 |
| 10,388,744 | B2* | 8/2019 | Tanaka | H01L 29/1054 |
| 2002/0167023 | A1* | 11/2002 | Chavarkar | H01L 29/7783 257/194 |
| 2008/0272443 | A1 | 11/2008 | Hoshi et al. | |
| 2012/0280280 | A1* | 11/2012 | Zhang | H01L 29/7786 257/194 |
| 2013/0214330 | A1 | 8/2013 | Briere et al. | |
| 2013/0313609 | A1* | 11/2013 | Akutsu | H01L 29/78 257/192 |
| 2014/0015608 | A1* | 1/2014 | Kotani | H01L 29/2003 330/277 |
| 2015/0054091 | A1* | 2/2015 | Vorhaus | H01L 27/0207 257/401 |

* cited by examiner

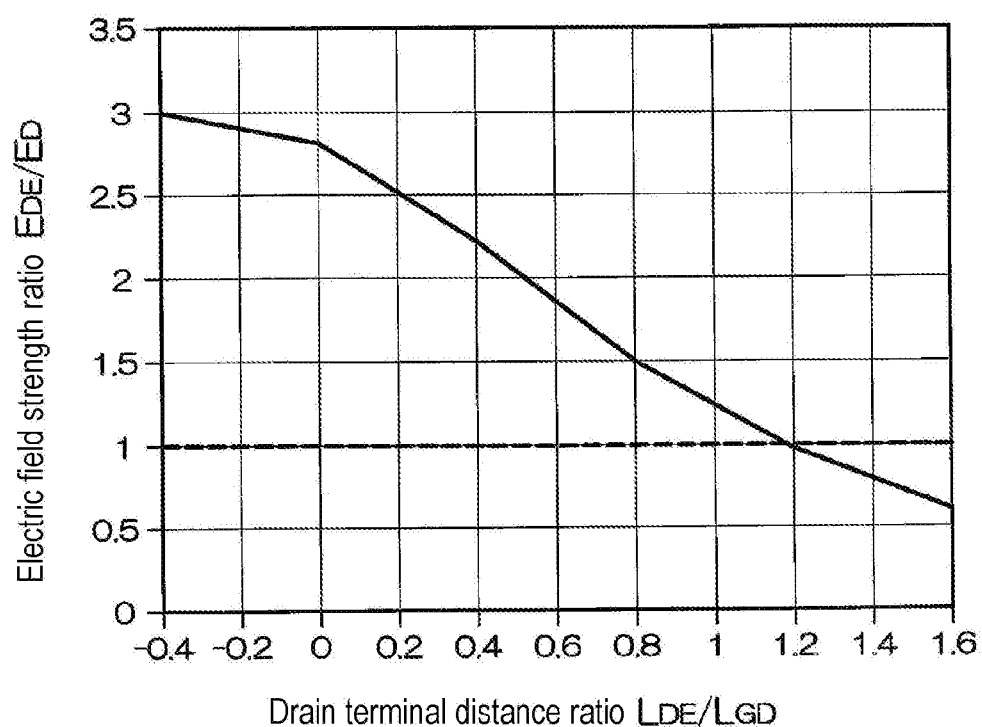

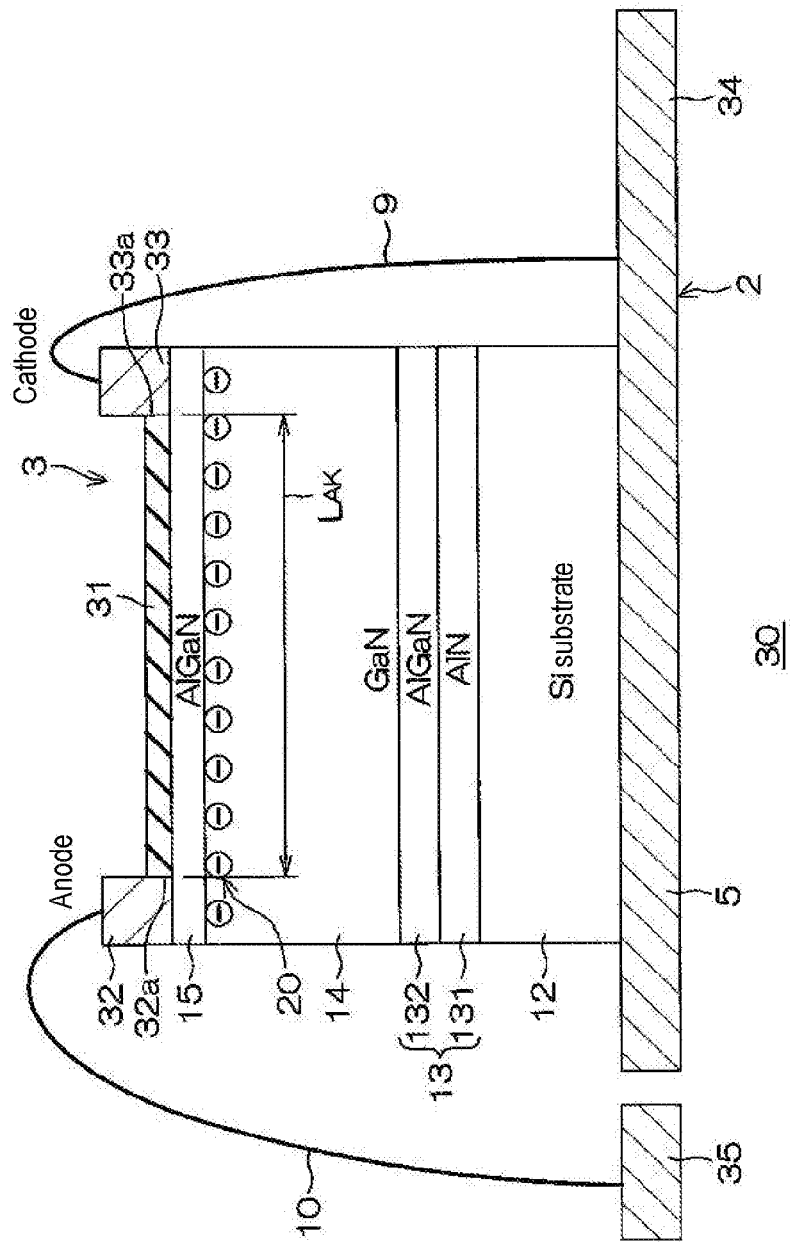

NITRIDE SEMICONDUCTOR DEVICE

CROSS-REFERENCE TO RELATED APPLICATIONS

This application is a Continuation of U.S. patent application Ser. No. 16/022,861, filed Jun. 29, 2018, entitled NITRIDE SEMICONDUCTOR DEVICE, and issued as U.S. Pat. No. 10,388,744 on Aug. 20, 2019. U.S. patent application Ser. No. 16/022,861 is a Continuation of U.S. patent application Ser. No. 15/232,517, filed on Aug. 9, 2016 and issued as U.S. Pat. No. 10,038,064 on Jul. 31, 2018, which is based upon and claims the benefit of priority from Japanese Patent Application No. 2015-158428, filed on Aug. 10, 2015 the specifications of which are incorporated by reference herein in their entirety.

TECHNICAL FIELD

The present disclosure relates to a nitride semiconductor device.

BACKGROUND

A high electron mobility transistor (HEMT) has a hetero-junction structure formed by stacking a low-temperature buffer layer made of GaN, a buffer layer made of GaN, an electron transit layer made of GaN, and an electron supply layer made of AlGaN in this order on a substrate. Further, the HEMT has a source electrode, a gate electrode, and a drain electrode on the electron supply layer.

In the HEMT, the electron supply layer has a large band gap energy, compared with the electron transit layer, and a two-dimensional (2D) electron gas layer is formed below a hetero-junction interface between the electron transit layer and the electron supply layer. The 2D electron gas layer is used as a carrier. That is, when the source electrode and the drain electrode are turned on, electrons supplied to the electron transit layer move in the 2D electron gas layer at a high speed to reach the drain electrode. At this time, by changing a thickness of a depletion layer under the gate electrode by controlling a voltage applied to the gate electrode, it is possible to control the electrons moving from the source electrode to the drain electrode, i.e., a drain current.

Regarding the HEMT, it has been generally considered that an electric field strength distribution between a gate and a drain during an off time is uniform. However, the electric field strength on the drain side may be maximized depending on the structure of the HEMT, leading to a possibility that the drain side reaches a dielectric breakdown. In particular, this phenomenon stands out as a drain voltage is increased.

Further, such a problem is not limited to the HEMT, and for example, may also arise between an anode and a cathode of a Schottky barrier diode. In this case, the dielectric breakdown may occur on the cathode side.

SUMMARY

The present disclosure provides some embodiments of a nitride semiconductor device capable of alleviating an electric field strength on a drain side or a cathode side during an off time.

According to one embodiment of the present disclosure, there is provided a nitride semiconductor device including: a nitride semiconductor layer; a gate electrode finger having at least one end portion, and extending along a surface of the nitride semiconductor layer; and a drain electrode finger having at least one end portion on the same side as that of the one end portion of the gate electrode finger, and extending along the gate electrode finger, wherein the one end portion of the drain electrode finger protrudes relative to the one end portion of the gate electrode finger.

In some embodiments, the gate electrode finger and the drain electrode finger may have the other end portions on the opposite sides of the one end portions, respectively, and the drain electrode finger may be formed to be longer than the gate electrode finger and the other end portion of the drain electrode finger protrudes relative to the other end portion of the gate electrode finger.

In some embodiments, a protrusion amount $L_{DE1}$ of the one end portion of the drain electrode finger may be greater than a distance $L_{GD}$ between the gate electrode finger and the drain electrode finger.

In some embodiments, a ratio ($L_{DE1}/L_{GD}$) between the protrusion amount $L_{DE1}$ and the distance $L_{GD}$ may be greater than 1.

In some embodiments, the protrusion amount $L_{DE1}$ may range from 3 μm to 45 μm, and the distance $L_{GD}$ may range from 3 μm to 15 μm.

According to another embodiment of the present disclosure, there is provided a nitride semiconductor device including: a nitride semiconductor layer; a gate electrode finger having at least one end portion, and extending along a surface of the nitride semiconductor layer; and a drain electrode finger configured to surround the one end portion of the gate electrode finger.

In some embodiments, the gate electrode finger may include a field plate selectively extending to the drain electrode finger side.

According to still another embodiment of the present disclosure, there is provided a nitride semiconductor device including: a nitride semiconductor layer; a gate electrode on the nitride semiconductor layer; and a source electrode and a drain electrode arranged on the nitride semiconductor layer with the gate electrode sandwiched therebetween, wherein the gate electrode is configured to surround the source electrode, and the drain electrode is configured to surround the source electrode and the gate electrode.

According to a further embodiment of the present disclosure, there is provided a nitride semiconductor device including: a nitride semiconductor layer; an anode electrode finger having at least one end portion, and extending along a surface of the nitride semiconductor layer; and a cathode electrode finger having at least one end portion on the same side as that of the one end portion of the anode electrode finger, and extending along the anode electrode finger, wherein the one end portion of the cathode electrode finger protrudes relative to the one end portion of the anode electrode finger.

In some embodiments, the anode electrode finger and the cathode electrode finger may have the other end portions on the opposite sides of the one end portions, respectively, and the cathode electrode finger may be formed to be longer than the anode electrode finger and the other end portion of the cathode electrode finger protrudes relative to that of the anode electrode finger.

According to still another embodiment of the present disclosure, there is provided a nitride semiconductor device including: a nitride semiconductor layer; an anode electrode finger having at least one end portion, and extending along a surface of the nitride semiconductor layer; and a cathode electrode finger configured to surround the one end portion of the anode electrode finger.

In some embodiments, the nitride semiconductor layer may include: a first nitride semiconductor layer containing Ga or Al; and an electron supply layer in contact with the first nitride semiconductor layer from above, the electron supply layer being formed of a second nitride semiconductor having a composition different from that of the first nitride semiconductor layer in an interface between the first nitride semiconductor layer and the electron supply layer.

In some embodiments, a deep acceptor concentration of the first nitride semiconductor layer may range from $1\times10^{16}$ $cm^{-3}$ to $1\times10^{18}$ $cm^{-3}$.

BRIEF DESCRIPTION OF THE DRAWINGS

FIGS. 11A and 11B are views illustrating a relationship between a drain terminal distance ratio and an electric field strength ratio.

FIG. 15 is a schematic cross-sectional view of a nitride semiconductor device (Schottky barrier diode) according to an embodiment of the present disclosure.

DETAILED DESCRIPTION

Embodiments of the present disclosure will now be described in detail with reference to the drawings.

Figure 1:
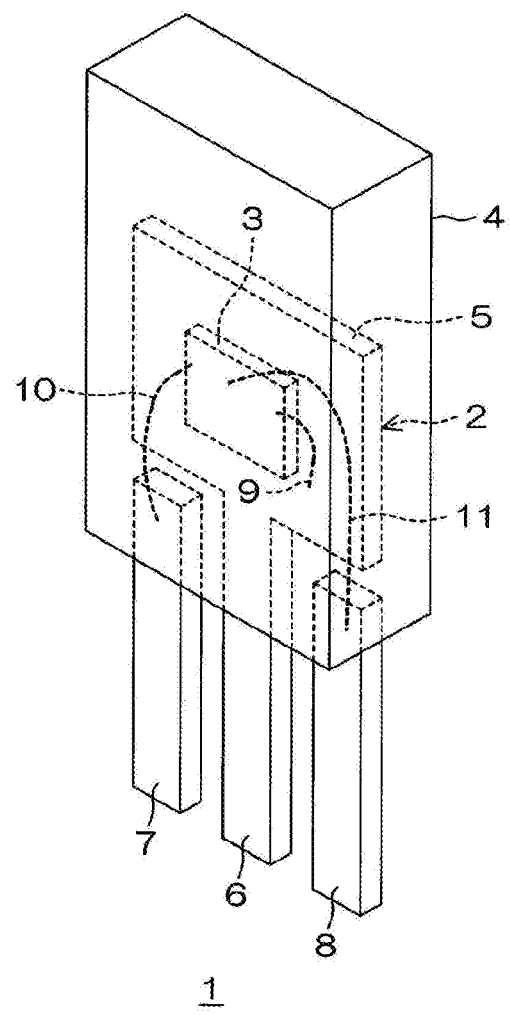
FIG. 1 is a view illustrating a semiconductor package having a nitride semiconductor device (HEMT) according to an embodiment of the present disclosure.

FIG. 1 is a view illustrating an appearance of a semiconductor package 1 having a nitride semiconductor device 3 (HEMT) according to an embodiment of the present disclosure.

The semiconductor package 1 includes a terminal frame 2, the nitride semiconductor device (chip) 3, and a resin package 4.

The terminal frame 2 has a plate shape made of a metal. The terminal frame 2 includes a base part (island) 5 that supports the nitride semiconductor device 3, a drain terminal 6, a source terminal 7, and a gate terminal 8. The drain terminal 6 is integrally formed with the base part 5. The drain terminal 6, the source terminal 7, and the gate terminal 8 are electrically connected to a drain, a source, and a gate of the nitride semiconductor device 3 by bonding wires 9 to 11, respectively. The source terminal 7 and the gate terminal 8 are arranged with the central drain terminal 6 sandwiched therebetween.

The resin package 4 is formed of a known mold resin such as, for example, an epoxy resin, and seals the nitride semiconductor device 3. The resin package 4 covers the base part 5 of the terminal frame 2 together with the nitride semiconductor device 3 and the bonding wires 9 to 11. The three terminals 6 to 8 are partially exposed from the resin package 4.

Figure 2:
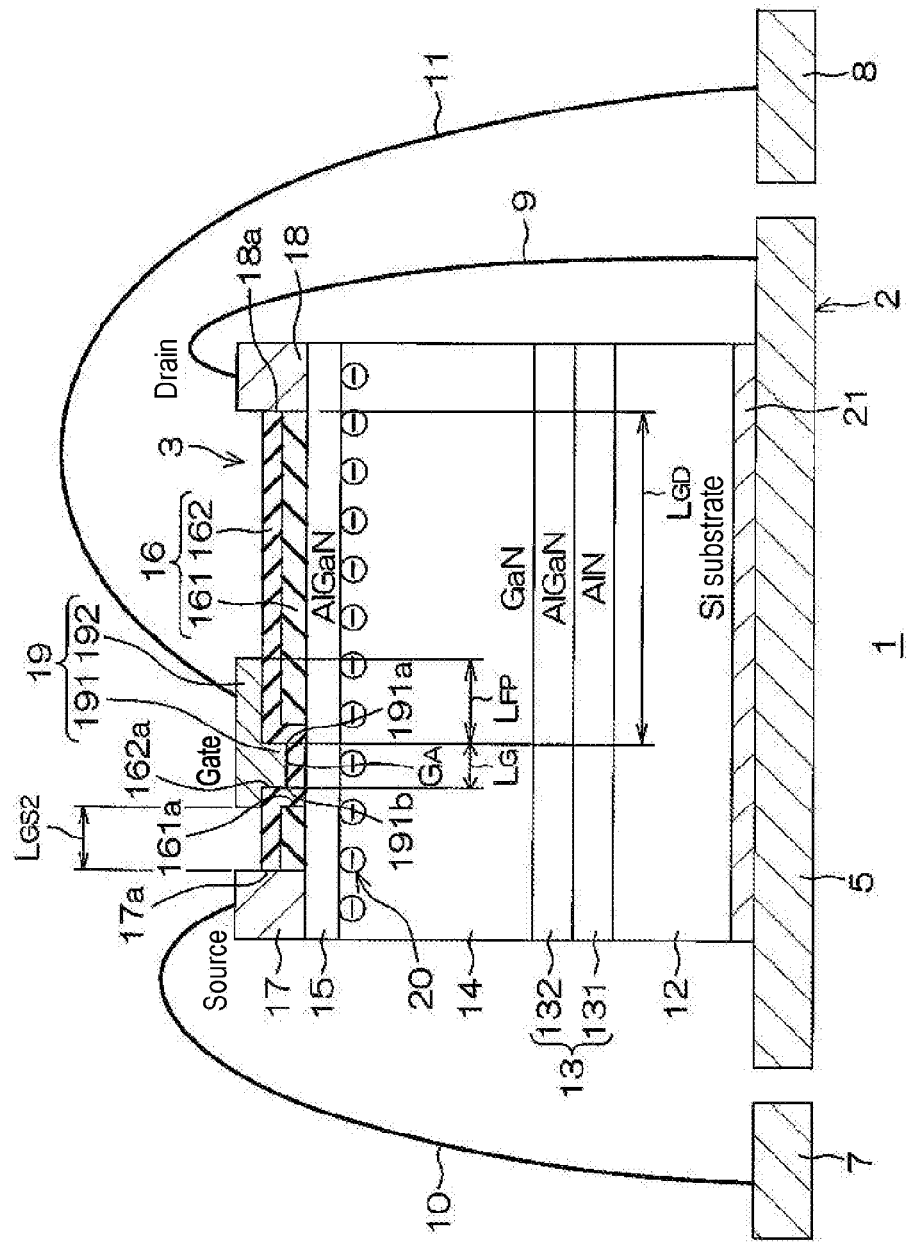
FIG. 2 is a schematic cross-sectional view of the nitride semiconductor device.
Figure 3:
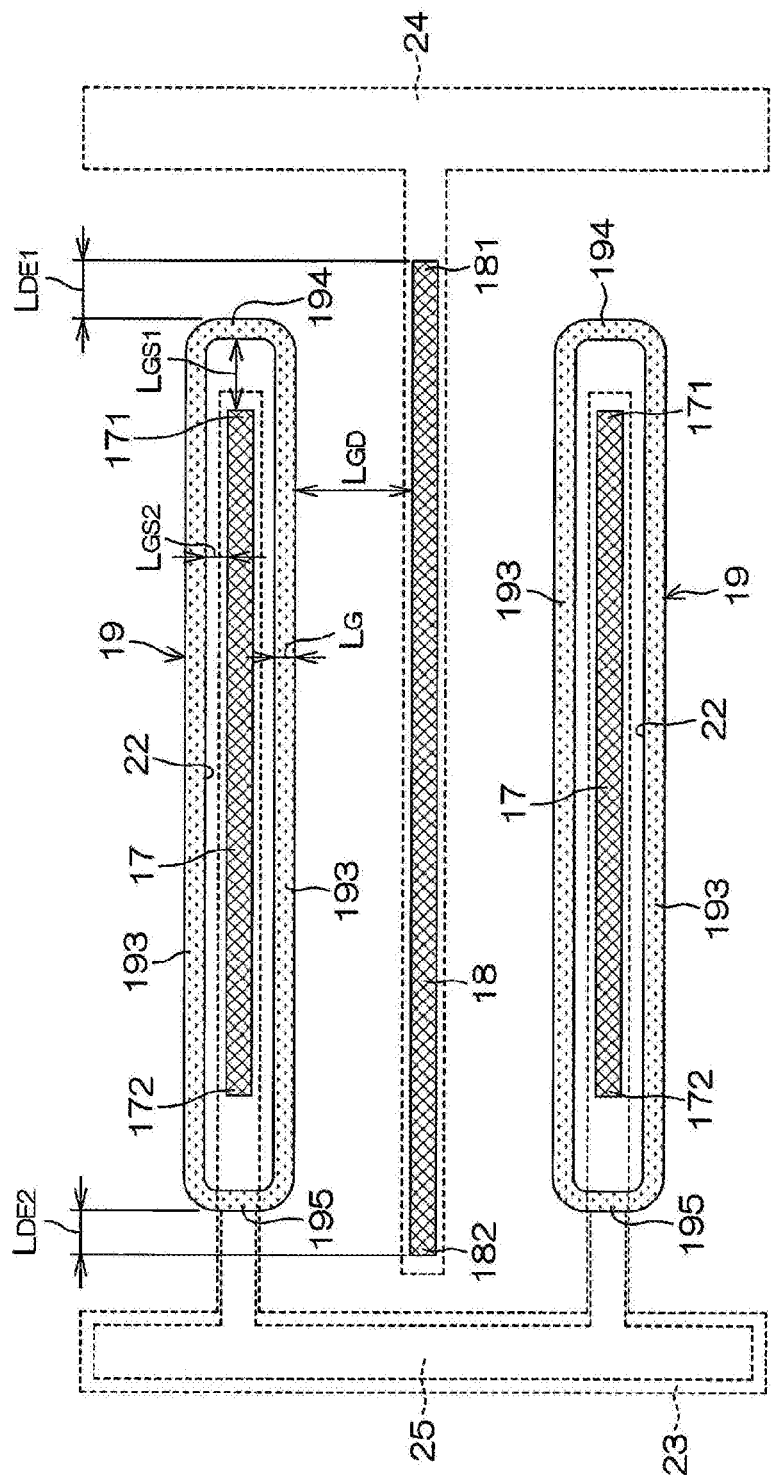
FIG. 3 is a view illustrating a planar layout (first form) of electrodes of the nitride semiconductor device.

FIG. 2 is a schematic cross-sectional view of the nitride semiconductor device 3. FIG. 3 is a view illustrating a planar layout (first form) of electrodes 17 to 19 of the nitride semiconductor device 3. Also, FIG. 2 illustrates a single cross-section of an aggregation of components considered to be required for the description of this embodiment, rather than a cross-section in a specific position of FIGS. 1 and 3.

The nitride semiconductor device 3 includes a substrate 12, a buffer layer 13 formed on a surface of the substrate 12, an electron transit layer 14 epitaxially grown on the buffer layer 13, and an electron supply layer 15 epitaxially grown on the electron transit layer 14. In addition, the nitride semiconductor device 3 includes a gate insulating film 16 covering the surface of the electron supply layer 15, and a source electrode 17 and a drain electrode 18 as ohmic electrodes in ohmic-contact with the electron supply layer 15 through contact holes 17a and 18a formed in the gate insulating film 16.

The substrate 12 may be, for example, a conductive silicon substrate. The conductive silicon substrate may have an impurity concentration ranging, for example, from $1\times10^{17}$ $cm^{-3}$ to $1\times10^{20}$ $cm^{-3}$ (more specifically, about $1\times10^{18}$ $cm^{-3}$).

The buffer layer 13 may be a multilayer buffer layer formed by stacking a first buffer layer 131 and a second buffer layer 132. The first buffer layer 131 is in contact with the surface of the substrate 12, and the second buffer layer 132 is stacked on the surface of the first buffer layer 131 (the surface at the opposite side of the substrate 12). The first buffer layer 131 is formed of an AlN film in this embodiment, and a thickness thereof may be, for example, about 0.2 µm. The second buffer layer 132 is formed of an AlGaN film in this embodiment, and a thickness thereof may be, for example, about 0.2 µm.

The gate insulating film 16 may be a multilayer gate insulating film formed by stacking a first insulating layer 161 and a second insulating layer 162. The first insulating layer 161 is in contact with the surface of the electron supply layer 15, and the second insulating layer 162 is stacked on the surface of the first insulating layer 161 (the surface at the opposite side of the electron supply layer 15). The first insulating layer 161 is formed of an SiN film in this embodiment, and a thickness thereof may be, for example, about 500 Å. The first insulating layer 161 may be formed through a plasma chemical vapor deposition (CVD) method, a thermal CVD method, sputtering, or the like. An opening 161a is formed in the first insulating layer 161 such that the second insulating layer 162 goes into the opening 161a and makes contact with the electron supply layer 15. The second insulating layer 162 is formed of alumina ($Al_aO_b$) in this embodiment, and a thickness thereof may be, for example, about 300 Å. The second insulating layer 162 has a concave portion 162a at a part going into the opening 161a of the first insulating layer 161. The second insulating layer 162 may be formed by precisely controlling a thickness thereof through, for example, an ALD method, or the like.

When an alumina film is intended to be formed through the ALD method, generally, there is a variation in a composition ratio a:b between Al and O and not all the alumina film is formed of $Al_2O_3$. This is because the ALD method is a relatively low temperature process. However, an insulator formed of Al and O may form an insulating layer having a large band gap and a high withstanding pressure, even though a composition thereof is not strictly controlled. In the present disclosure, even a case where the composition ratio a:b between Al and O is not 2:3 inclusive will be called "alumina".

The electron transit layer 14 and the electron supply layer 15 are formed of Group III nitride semiconductors (hereinafter, simply referred to as "nitride semiconductors") having different Al compositions. For example, the electron transit layer 14 may be formed of a GaN layer and a thickness thereof may be about 0.5 μm. The electron supply layer 15 is formed of an $Al_xGa_{1-x}N$ layer (where 0<x<1) in this embodiment, and a thickness thereof may range, for example, from 5 nm to 30 nm (more specifically, about 20 nm).

In this manner, the electron transit layer 14 and the electron supply layer 15 are formed of nitride semiconductors having different Al compositions and form a heterojunction, and a lattice mismatch also occurs therebetween. Further, due to the polarization caused by the hetero-junction and the lattice mismatch, a 2D electron gas 20 spreads in a position close to an interface between the electron transit layer 14 and the electron supply layer 15 (for example, a position about a few Å away from the interface).

In the electron transit layer 14, with respect to its energy band structure, a shallow donor level $E_D$, a deep donor level $E_{DD}$, a shallow acceptor level $E_A$, and a deep acceptor level $E_{DA}$ may be formed.

The shallow donor level $E_D$ is an energy level, for example, in a position 0.025 eV or less away from an energy level $E_C$ of a lower end (bottom) of a conduction band of the electron transit layer 14, and the shallow donor level $E_D$ may be simply called a "donor level $E_D$" if it can be distinguished from the deep donor level $E_{DD}$. In general, an electron of a donor doped in this position is excited to the conduction band even at room temperature (thermal energy kT=about 0.025 eV) to become a free electron. An impurity doped in the GaN electron transit layer 14 to form the shallow donor level $E_D$ may be at least one selected from the group consisting of, for example, Si and O. On the other hand, the deep donor level $E_{DD}$ is an energy level, for example, in a position 0.025 eV or more away from the energy level $E_C$ of the lower end (bottom) of the conduction band of the electron transit layer 14. That is, the deep donor level $E_{DD}$ is formed by doping a donor having an ionization energy required for excitation greater than the thermal energy at room temperature. Thus, in general, the electron of the donor doped in this position is not excited to the conduction band at room temperature but in a state of being captured in the donor.

The shallow acceptor level $E_A$ is an energy level, for example, in a position 0.025 eV or less away from an energy level $E_V$ of an upper end (top) of a valence electron of the electron transit layer 14. The shallow acceptor level $E_A$ may be simply called an "acceptor level $E_A$" if it can be distinguished from the deep acceptor level $E_{DA}$. In general, a hole of an acceptor doped in this position is a free hole excited to the valence band even at room temperature (thermal energy kT=about 0.025 eV). On the other hand, the deep acceptor level $E_{DA}$ is an energy level, for example, in a position 0.025 eV or more away from the energy level $E_V$ of the upper end (top) of the valence electron of the electron transit layer 14. That is, the deep acceptor level $E_{DA}$ is formed by doping an acceptor having an ionization energy required for excitation greater than the thermal energy at room temperature. Thus, generally, the hole of the acceptor doped in this position is not excited to the valance band at room temperature but in a state of being captured in the acceptor. An impurity doped in the electron transit layer 14 formed of GaN to form the deep acceptor level $E_{DA}$ may be at least one selected from the group consisting of, for example, C, Be, Cd, Ca, Cu, Ag, Au, Sr, Ba, Li, Na, K, Sc, Zr, Fe, Co, Ni, Ar, and He.

Further, in this embodiment, concentrations of impurities (dopants) respectively forming the shallow donor level $E_D$, the deep donor level $E_{DD}$, the shallow acceptor level $E_A$, and the acceptor level $E_{DA}$ described above will be called a shallow donor concentration $N_D$, a deep donor concentration $N_{DD}$, a shallow acceptor concentration $N_A$, and a deep acceptor concentration $N_{DA}$, respectively. For example, when only carbon having a concentration of $0.5 \times 10^{16}$ cm$^{-3}$ is doped in the electron transit layer 14 as an impurity forming the deep acceptor level $E_{DA}$, the carbon concentration is defined as the deep acceptor concentration $N_{DA}$. These concentrations $N_D$, $N_{DD}$, $N_A$, and $N_{DA}$ may be measured by, for example, secondary ion mass spectrometry (SIMS).

An impurity concentration of the entire electron transit layer 14 is, in some embodiments, $N_A+N_{DA}-N_D-N_{DD}>0$. This inequality means that the sum ($N_A+N_{DA}$) of impurity concentration of the acceptor atom capable of capturing an emitted electron is greater than the sum ($N_D+N_{DD}$) of impurity concentration of a donor atom capable of emitting the electron. That is, in the electron transit layer 14, since almost all the electrons emitted from a shallow donor atom and a deep donor atom are not excited to the conduction band but captured in the shallow acceptor atom or the deep acceptor atom, the electron transit layer 14 is a semi-insulating i-type GaN.

In this embodiment, for example, the shallow donor concentration $N_D$ may range from $1 \times 10^{16}$ cm$^{-3}$ to $1 \times 10^{17}$ cm$^{-3}$, the deep donor concentration $N_{DD}$ may range from $1 \times 10^{16}$ cm$^{-3}$ to $1 \times 10^{17}$ cm$^{-3}$, the shallow acceptor concentration $N_A$ may range from $1 \times 10^{16}$ cm$^{-3}$ to $5 \times 10^{16}$ cm$^{-3}$, and the deep acceptor concentration $N_{DA}$ may range from $1 \times 10^{16}$ cm$^{-3}$ to $1 \times 10^{18}$ cm$^{-3}$.

The electron supply layer 15 may have an AlN layer having a thickness of about a few atoms (5 nm or less, in some embodiments, 1 nm to 5 nm, in some other embodiments, 1 nm to 3 nm) in an interface with the electron transit layer 14. Such an AlN layer suppresses electron scattering, contributing to the enhancement of electron mobility.

As illustrated in FIG. 3, a plurality of (two in FIG. 3) source electrodes 17 are arranged to be spaced from each other on the electron supply layer 15, and each of the source electrodes 17 may be surrounded by the gate electrode 19. The drain electrode 18 may be arranged in a region between the source electrodes 17 surrounded by the gate electrode 19.

Each of the source electrodes 17 extends in a linear shape having a first end portion 171 and a second end portion 172, and may be called a source electrode finger depending on the shape thereof.

The gate electrode 19 may be formed to have an annular shape along an outer periphery of the corresponding source electrode 17. For example, the gate electrode 19 may be formed to have an annular shape integrally having a pair of linear finger portions 193 extending to be parallel to each other with the source electrode 17 interposed therebetween and a first connection portion 194 and a second connection portion 195 connecting the end portions of the corresponding finger portions 193. Thus, the source electrode 17 may be disposed in an elongated closed region 22 on an inner side of the gate electrode 19. In the closed region 22, a distance $L_{GS1}$ between the connection portions 194 and 195 of the gate electrode 19 and the source electrode 17 (the end portions 171 and 172) may be longer than a distance $L_{GS2}$ between the finger portion 193 of the gate electrode 19 and the source electrode 17 (a side portion) (distance $L_{GS1}$>distance $L_{GS2}$).

The drain electrode 18 extends in a line shape having a first end portion 181 and a second end portion 182 and may be called a drain electrode finger depending on the shape thereof. The first end portion 181 of the drain electrode 18 is an end portion on the same side as those of the first end portion 171 of the source electrode 17 and the first connection portion 194 of the gate electrode 19, and the second end portion 182 of the drain electrode 18 is an end portion on the same side as those of the second end portion 172 of the source electrode 17 and the second connection portion 195 of the gate electrode 19.

In this embodiment, the drain electrode 18 is formed to be longer than the finger portion 193 of the gate electrode 19. The first end portion 181 of the drain electrode 18 may protrude relative to the first connection portion 194 of the gate electrode 19. Also, the second end portion 182 of the drain electrode 18 may protrude relative to the second connection portion 195 of the gate electrode 19. In this embodiment, a protrusion amount $L_{DE1}$ of the first end portion 181 and a protrusion amount $L_{DE2}$ of the second end portion 182 may be equal (protrusion amount $L_{DE1}$=protrusion amount $L_{DE2}$). For example, the protrusion amount $L_{DE1}$ (=protrusion amount $L_{DE2}$) may range from 3 μm to 45 μm.

Also, the protrusion amount $L_{DE1}$ (=protrusion amount $L_{DE2}$) may be greater than a distance $L_{GD}$ between the finger portion 193 of the gate electrode 19 and the drain electrode 18. For example, a ratio ($L_{DE1}$, $L_{DE2}$/$L_{GD}$) between the protrusion amount $L_{DE1}$ (=protrusion amount $L_{DE2}$) and the distance $L_{GD}$ may be 1 to 5. The distance $L_{GD}$ may specifically range from 3 μm to 15 μm.

A source line 23, a drain line 24, and a gate line 25 are connected to the source electrode 17, the drain electrode 18, and the gate electrode 19, respectively. For example, the source line 23 and the gate line 25 may be drawn to the second end portion 182 side of the drain electrode 18. For example, the drain line 24 may be drawn to the opposite side (i.e., to the first end portion 181 side of the drain electrode 18) of the side to which the source line 23 and the gate line 25 are drawn. Although not shown in FIG. 3, the bonding wires 9 to 11 illustrated in FIG. 1 are electrically connected to the source line 23, the drain line 24, and the gate line 25, respectively.

Referring back to FIG. 2, in the cross-sectional view, the source electrode 17 and the drain electrode 18 are arranged to be spaced apart from each other, and the gate electrode 19 is interposed therebetween. The gate electrode 19 faces the electron supply layer 15 through the gate insulating film 16. FIG. 2 illustrates only some parts of the plurality of electrodes 17 to 19 illustrated in FIG. 3.

The gate electrode 19 may be formed of a stacked electrode film having a lower layer in contact with the gate insulating film 16 and an upper layer stacked on the lower layer. The lower layer may be formed of Ni, Pt, Mo, W, or TiN, and the upper layer may be formed of Au or Al. The gate electrode 19 is formed to be close to the source electrode 17, forming an asymmetrical structure in which a distance between the gate and the drain is longer than a distance between the gate and the source. The asymmetrical structure alleviates a high electric field formed between the gate and the drain, contributing to the enhancement of withstanding pressure.

The gate electrode 19 has a gate body portion 191 formed in the concave portion 162a of the second insulating layer 162 between the source electrode 17 and the drain electrode 18 and a field plate portion 192 connected to the gate body portion 191 and extending toward the drain electrode 18 on the gate insulating film 16 outside of the opening 161a. A distance $L_{FP}$ from a drain side end 191a, which is an end portion of the gate body portion 191 at the drain electrode 18 side in an interface between the gate body portion 191 and the second insulating layer 162, to an end portion of the field plate portion 192 at the drain electrode 18 side is called a field plate length. On the other hand, a distance $L_G$ from the drain end 191a to a source end 191b, which is an end portion of the gate body portion 191 at the source electrode 17 side in an interface between the gate body portion 191 and the second insulating layer 162, is called a gate length. That is, a width of an effective gate zone (a region within the concave portion 162a) $G_A$, which is a contact zone between the gate electrode 19 and a bottom surface of the concave portion 162a of the second insulating layer 162 is called a gate length. Also, in the present disclosure, a distance between the gate body portion 191 and the drain electrode 18 is indicated as $L_{GD}$.

The field plate length $L_{FP}$ may be ⅒ to ½ of the distance $L_{GD}$ between the gate and the drain. Specifically, the field plate length $L_{FP}$ may range from 0.1 μm to 0.5 μm. On the other hand, the gate length $L_G$ may range from 0.1 μm to 1.0 μm. Specifically, the gate length $L_G$ may range from 0.2 μm to 0.5 μm.

The source electrode 17 and the drain electrode 18 are ohmic electrodes including, for example, Ti and Al, and are electrically connected to the 2D electron gas 20 through the electron supply layer 15.

A rear electrode 21 is formed on a rear surface of the substrate 12, and the substrate 12 is connected to the base part 5 through the rear electrode 21. Thus, in this embodiment, the substrate 12 is electrically connected to the drain electrode 18 through the bonding wire 9, having a drain potential.

In the nitride semiconductor device 3, the electron supply layer 15 having a different Al composition is formed on the electron transit layer 14 to form a hetero-junction. Thus, the 2D electron gas 20 is formed in the electron transit layer 14 near the interface between the electron transit layer 14 and the electron supply layer 15, and the HEMT using the 2D electron gas 20 as a channel is formed. The gate electrode 19 faces the electron supply layer 15 with the gate insulating film 16 interposed therebetween. When a voltage having an appropriate negative value is applied to the gate electrode 19, the channel formed in the 2D electron gas 20 may be blocked. Thus, it is possible to turn the current flow on and off between the source and the drain by applying a control voltage to the gate electrode 19.

When used, for example, a predetermined voltage (e.g., 200 V to 600 V) making the drain electrode 18 side positive is applied between the source electrode 17 and the drain electrode 18. In this state, an OFF voltage (e.g., −5 V) or an ON voltage (e.g., 0 V) is applied to the gate electrode 19, using the source electrode 17 as a reference potential (0 V).

As described above, the end portion of the drain electrode 18 of this embodiment protrudes relative to the end portion of the gate electrode 19. More specifically, FIG. 3 illustrates a configuration in which the first end portion 181 of the drain electrode 18 protrudes relative to the first connection portion 194 of the gate electrode 19, and the second end portion 182 of the drain electrode 18 protrudes relative to the second connection portion 195 of the gate electrode 19. With this configuration, the nitride semiconductor device 3 can alleviate an electric field strength applied to the first and second end portions 181 and 182 of the drain electrode 18 when turned off.

Meanwhile, when both end portions of the drain electrode 18 do not protrude relative to the end portion of the gate electrode 19, the electric field strength applied to the end portions of the drain electrode 18 when turned off tends to be increased. This tendency may be explained based on the simulation results as follows.

Figure 4:
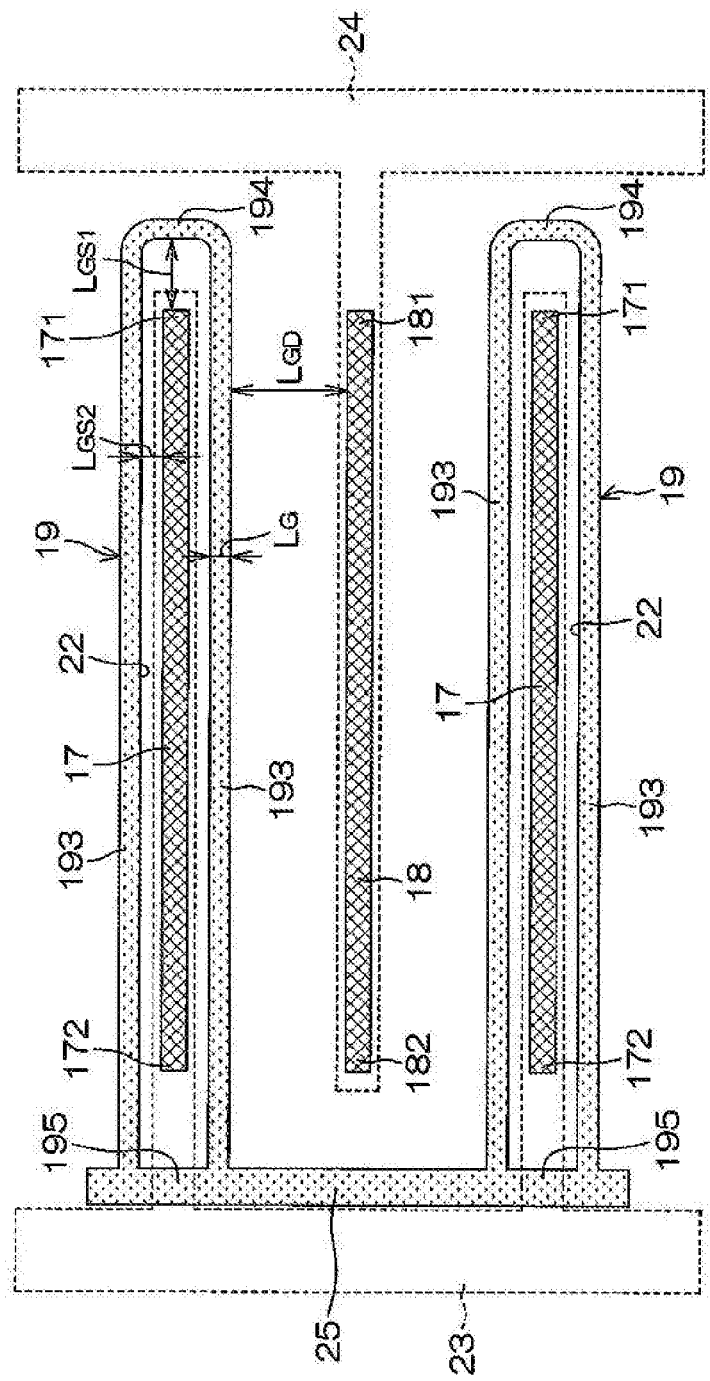
FIG. 4 is a view illustrating a planar layout (reference form) of electrodes.
Figure 5:
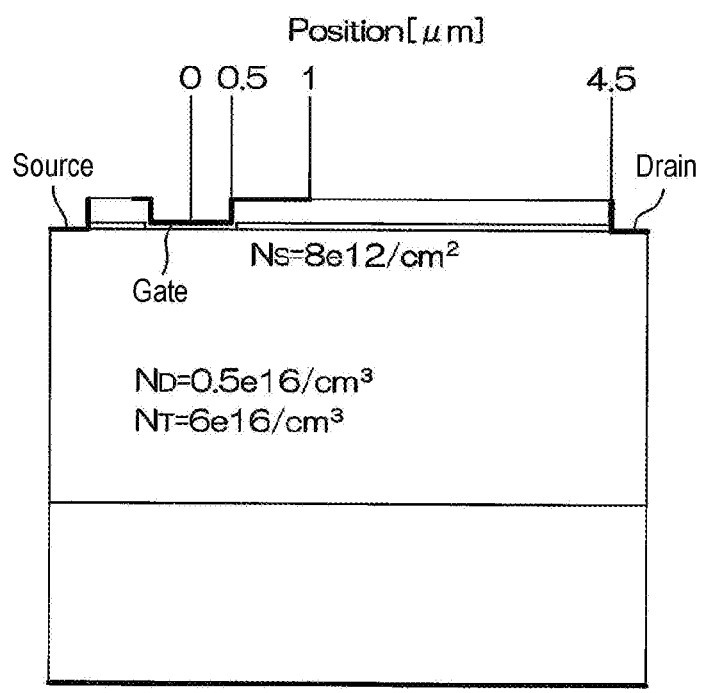
FIG. 5 is a view illustrating a cross-sectional structure of a GaN-HEMT used in a simulation.

First, a structure used in a simulation will be described. FIG. 4 is a view illustrating a planar layout (reference form) of the electrodes 17 to 19 regarding a reference form used in a simulation. FIG. 5 is a view illustrating a cross-sectional structure of a GaN-HEMT used in a simulation.

As illustrated in FIG. 4, in the GaN-HEMT structure used in the simulation, in the plane view, the first and second end portions 181 and 182 of the drain electrode 18 are flush with the first and second end portions 171 and 172 of the source electrode 17 and retreated inwardly from the first and second connection portions 194 and 195 of the gate electrode 19. Further, as illustrated in FIG. 5, a donor concentration $N_D$ of GaN was set to $0.5 \times 10^{16}$ cm$^{-3}$, a trap concentration $N_T$ was set to $6 \times 10^{16}$ cm$^{-3}$, and a sheet carrier concentration $N_S$ of a 2D electron gas was set to $8 \times 10^{12}$ cm$^{-2}$. In FIG. 5, "Position" represents a distance from the center of the gate electrode 19 in a width direction, and corresponds to a "Position" in a horizontal axis of the graphs of FIGS. 6 to 8.

Figure 6:
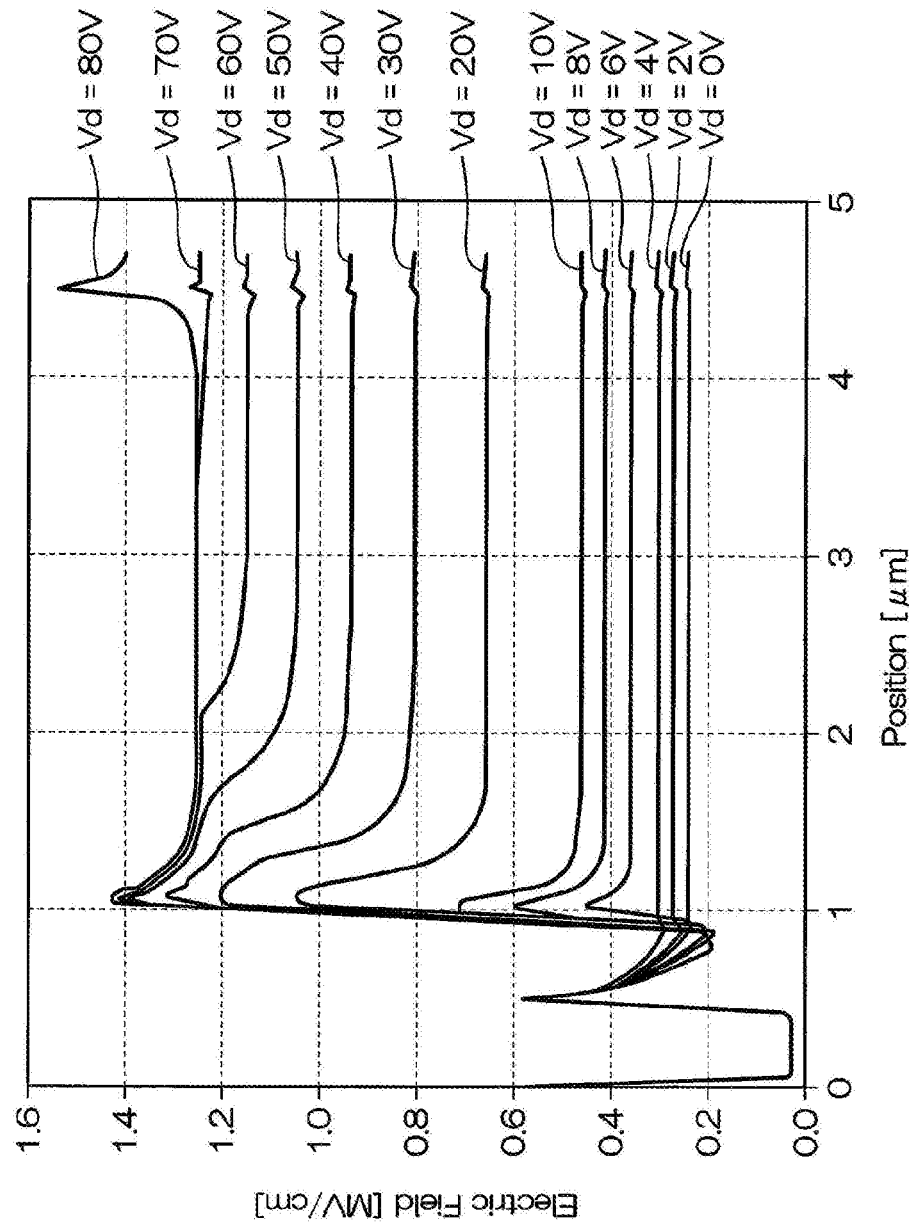
FIG. 6 is a view illustrating a simulation result of electric field strength.
Figure 7:
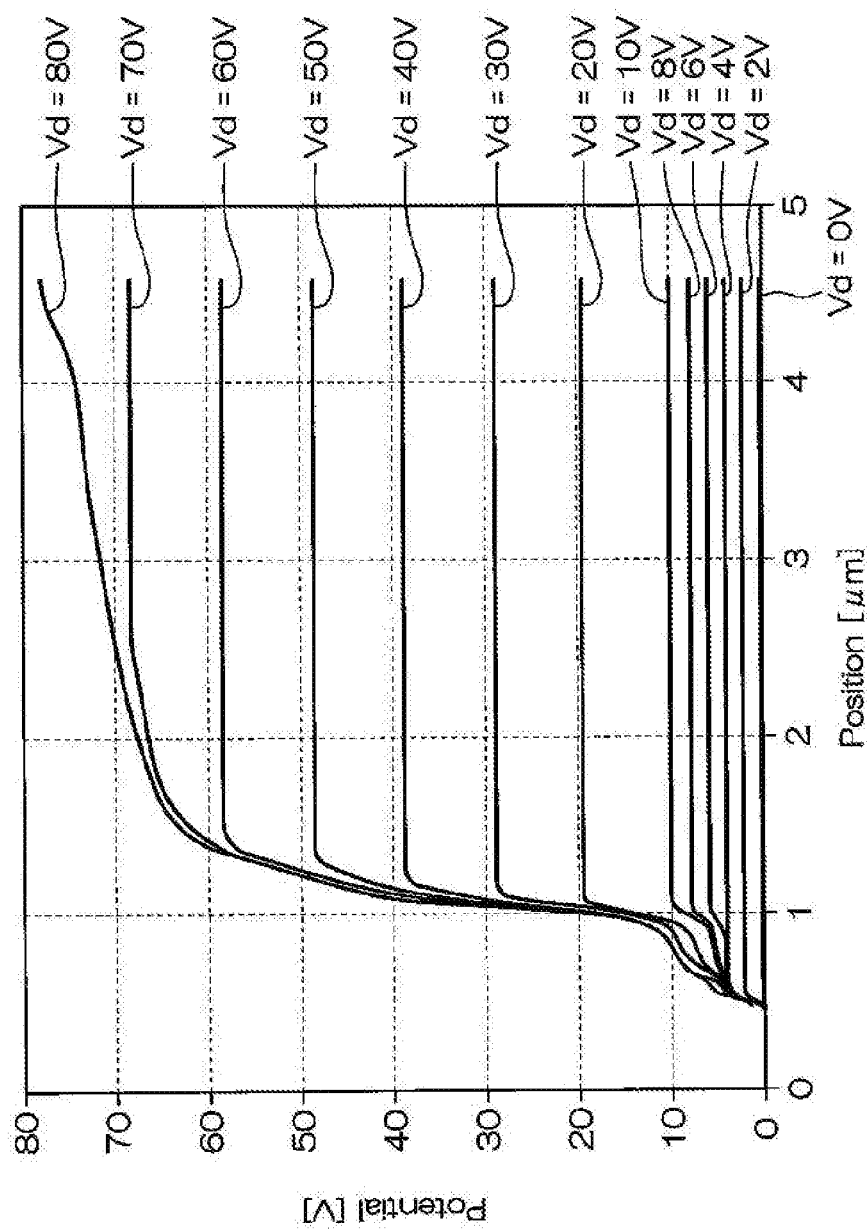
FIG. 7 is a view illustrating a simulation result of potential.
Figure 8:
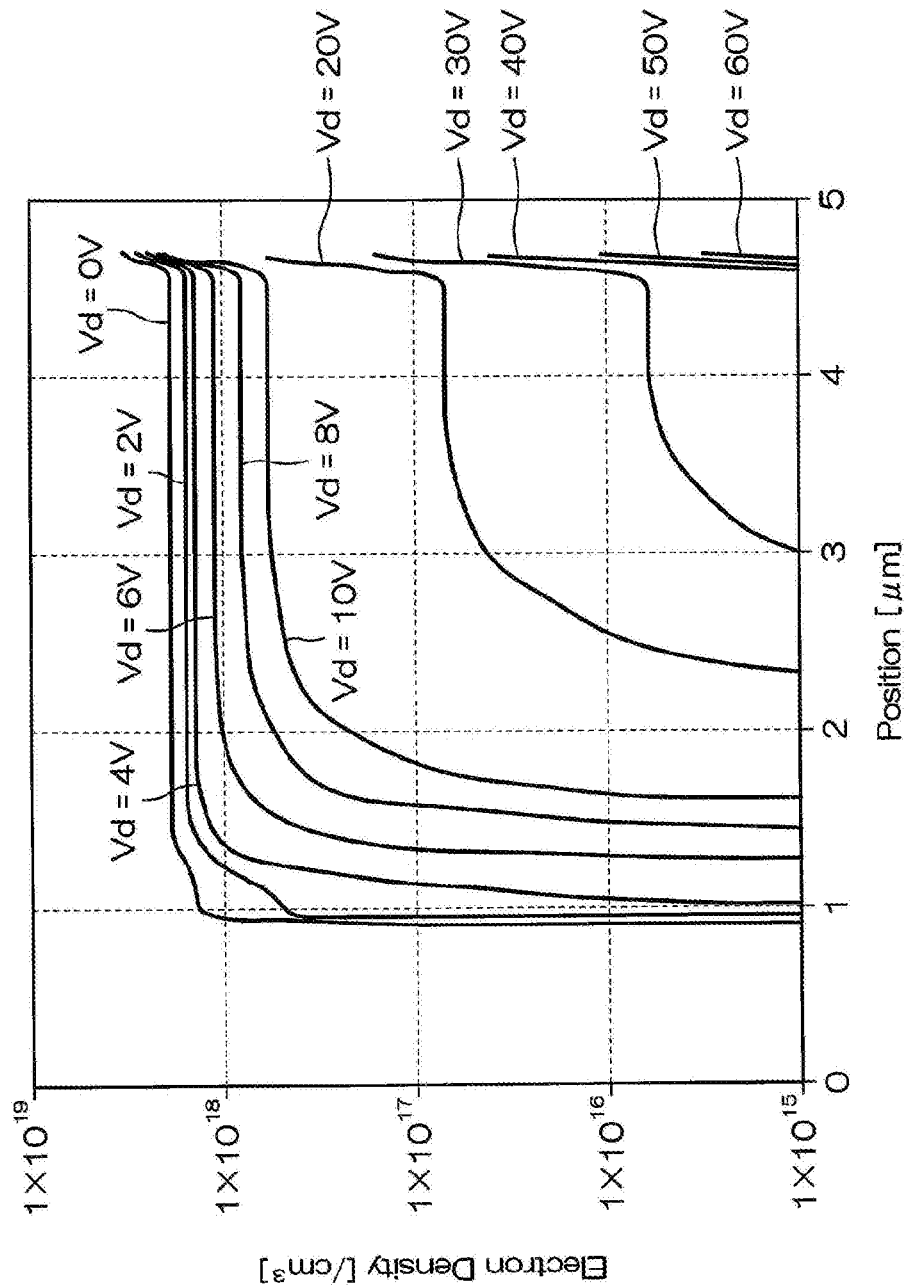
FIG. 8 is a view illustrating a simulation result of electron density.

Regarding the above structure, a simulation was conducted to inspect a relationship between a distance (position) from the gate electrode 19, and an electric field strength, a potential and an electron density. The results are illustrated in FIGS. 6 to 8. FIG. 6 is a view illustrating a simulation result of electric field strength. FIG. 7 is a view illustrating a simulation result of potential. FIG. 8 is a view illustrating a simulation result of electron density.

According to the results of FIGS. 6 to 8, when a drain voltage Vd is small, the electric field strength on the gate side (the left side of the horizontal axis) is high, whereas as the drain voltage Vd is increased, the electric field strength is increased on the drain side (the right side of the horizontal axis). That is, it is considered that the electric field strength on the drain side is maximized when the 2D electron gas is entirely depleted.

Figure 9:
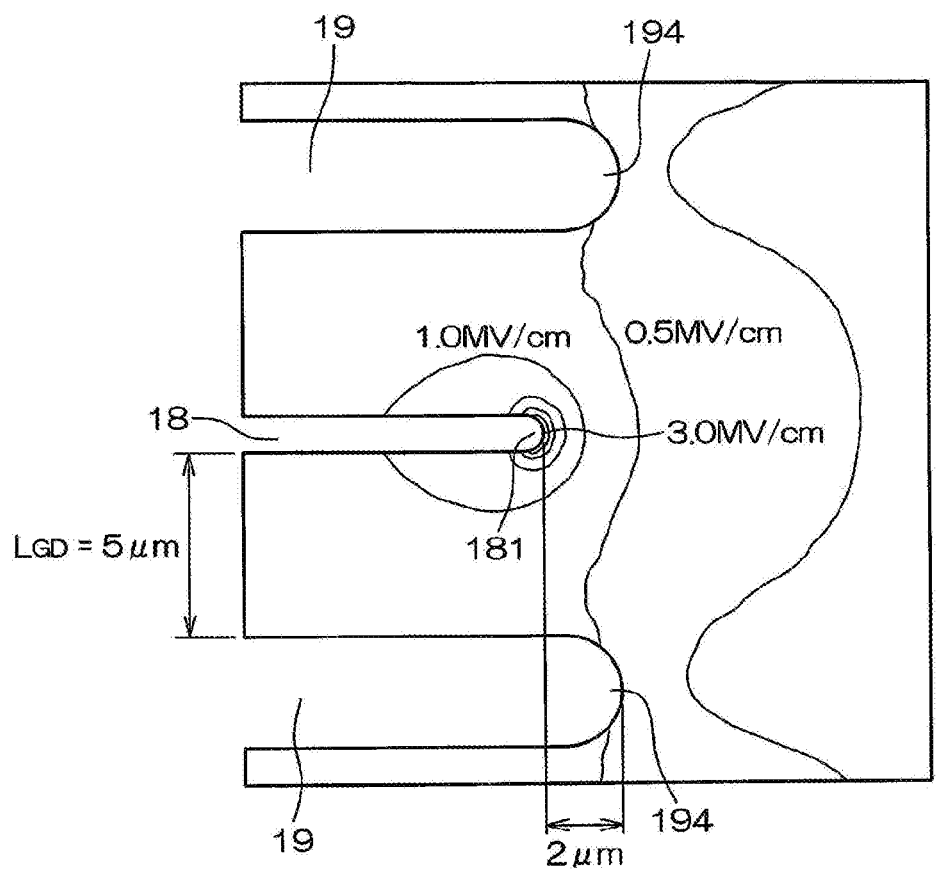
FIG. 9 is a view illustrating an electric field strength distribution of the reference form.

The inventor of the present application obtained how the electric field strength is distributed near the end portion of the drain electrode 18 in the case of the reference form through a simulation. The results are illustrated in FIG. 9. Also, in FIG. 9, the electric field strength distribution near the first end portion 181 is illustrated as a representative example, among both end portions of the drain electrode 18.

As illustrated in FIG. 9, in the case where the protrusion amount $L_{DE1}$ of the drain electrode 18 is $-2$ μm (i.e., 2 μm retreated), the electric field strength of the first end portion 181 of the drain electrode 18 is 3.0 MV/cm. In this connection, the results of obtaining the electric field strength distribution regarding the layout (for example, the protrusion amount $L_{DE1}$=4 μm and the distance $L_{GD}$=5 μm) of FIG. 3 in the same manner show that the electric field strength of the first end portion 181 of the drain electrode 18 is 1.5 MV/cm and is reduced to about 50% of the reference form, as illustrated in FIG. 10.

Figure 11A:
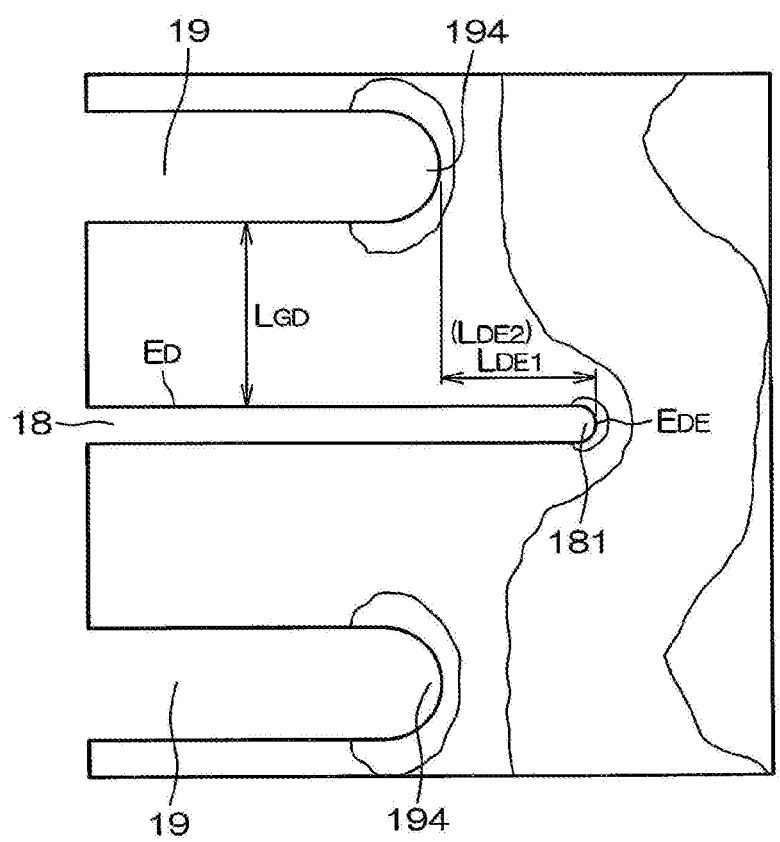

Thereafter, a relationship between a ratio ($L_{DE1}$, $L_{DE2}$/$L_{GD}$) of the protrusion amount $L_{DE1}$ (=protrusion amount $L_{DE2}$) to the distance $L_{GD}$ and a ratio ($E_{DE}$/$E_D$) of electric field strength $E_{DE}$ of the first end portion 181 of the drain electrode 18 to the electric field strength $E_D$ of a portion of the drain electrode 18 facing the gate electrode 19 illustrated in FIG. 11A was obtained. The results are illustrated in FIG. 11B. It was shown in FIG. 11B that the electric field strength $E_{DE}$ is effectively reduced in the end portion of the drain electrode 18 as the protrusion amount $L_{DE1}$ of the drain electrode 18 is increased and $L_{DE1}/L_{GD}$ is increased.

Figure 10:
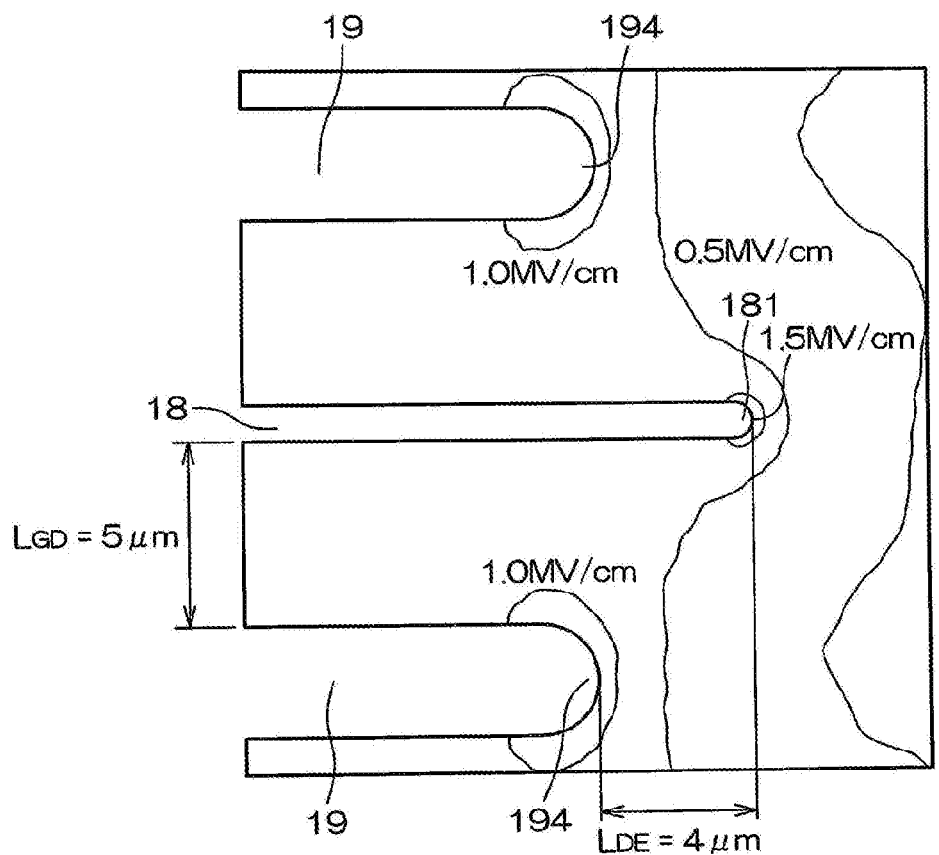
FIG. 10 is a view illustrating an electric field strength distribution of the first form.

For example, as illustrated in FIG. 10, $E_{DE}/E_D$=1.5 under the condition that the protrusion amount is $L_{DE1}$=4 μm and the distance is $L_{GD}$=5 μm (i.e., $L_{DE1}/L_{GD}$=0.8), whereas it can be reduced to $E_{DE1}/E_D$=1 under the condition that the protrusion amount is $L_{DE1}$=6 μm and the distance is $L_{GD}$=5 μm (i.e., $L_{DE1}/L_{GD}$=1.2).

Figure 12:
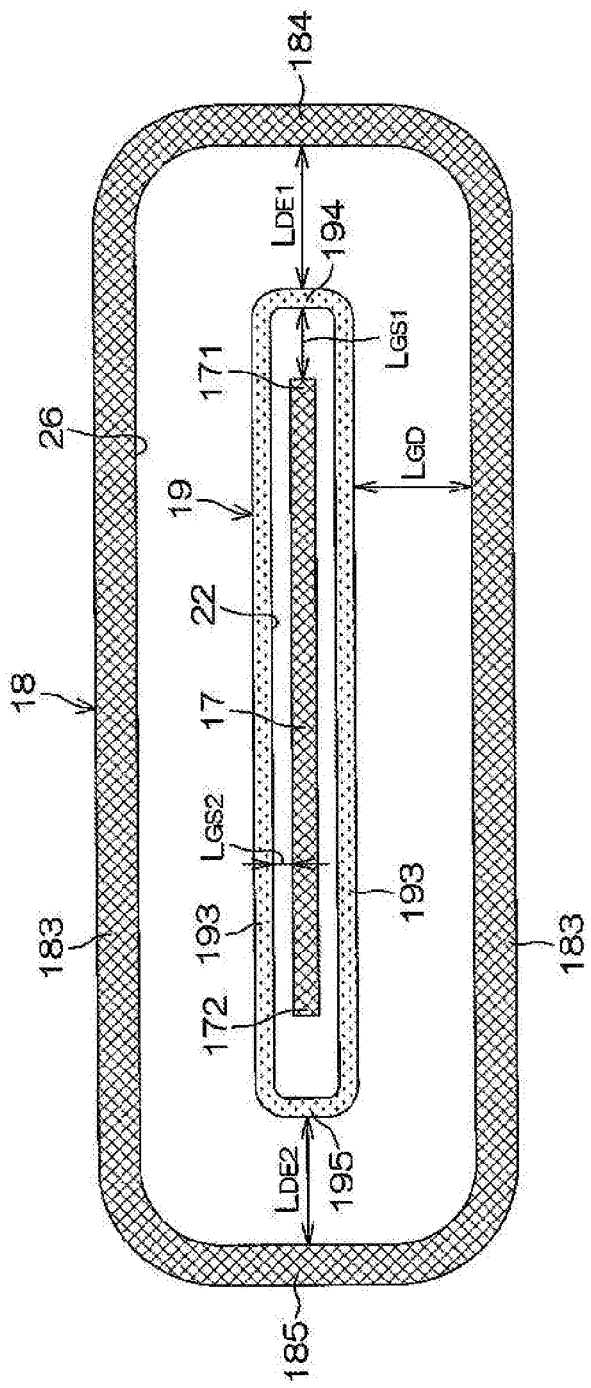
FIG. 12 is a view illustrating a planar layout (second form) of the electrodes of the nitride semiconductor device.
Figure 13:
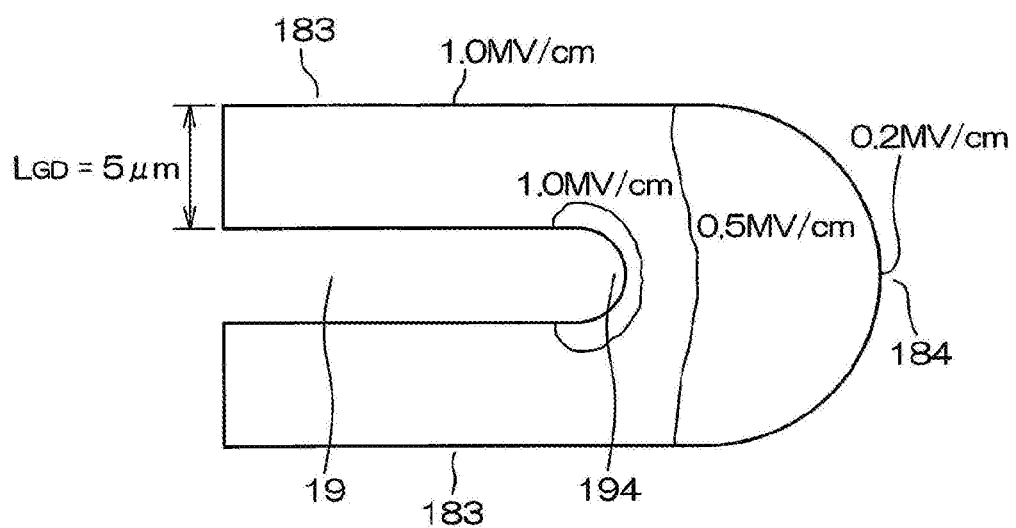
FIG. 13 is a view illustrating an electric field strength distribution of the second form.

FIG. 12 is a view illustrating a planar layout (second form) of the electrodes 17 to 19 of the nitride semiconductor device 3. FIG. 13 is a view illustrating an electric field strength distribution of the second form.

In the nitride semiconductor device 3, the drain electrode 18 may be formed to have an annular shape along an outer periphery of the gate electrode 19. For example, the drain electrode 18 may be formed to have an annular shape integrally having a pair of linear finger portions 183 extending to be parallel to each other with the gate electrode 19 interposed therebetween and a first connection portion 184 and a second connection portion 185 connecting end portions of the corresponding finger portions 183. Accordingly, the source electrode 17 and the gate electrode 19 may be disposed in an elongated closed region 26 on the inner side of the drain electrode 18. In the closed region 26, the distances between the connection portions 184 and 185 of the drain electrode 18 and the connection portions 194 and 195 of the gate electrode 19 correspond to the protrusion amount $L_{DE1}$ and the protrusion amount $L_{DE2}$, respectively.

It was also shown that, when the drain electrode 18 is configured to surround the source electrode 17 and the gate electrode 19, for example, as illustrated in FIG. 13, the electric field strength in the first connection portion 184 corresponding to the end portion of the drain electrode 18 is 0.2 MV/cm and reduced to about 7% of that of the reference form (the electric field strength: 3.0 MV/cm) illustrated in FIG. 9.

Figure 14:
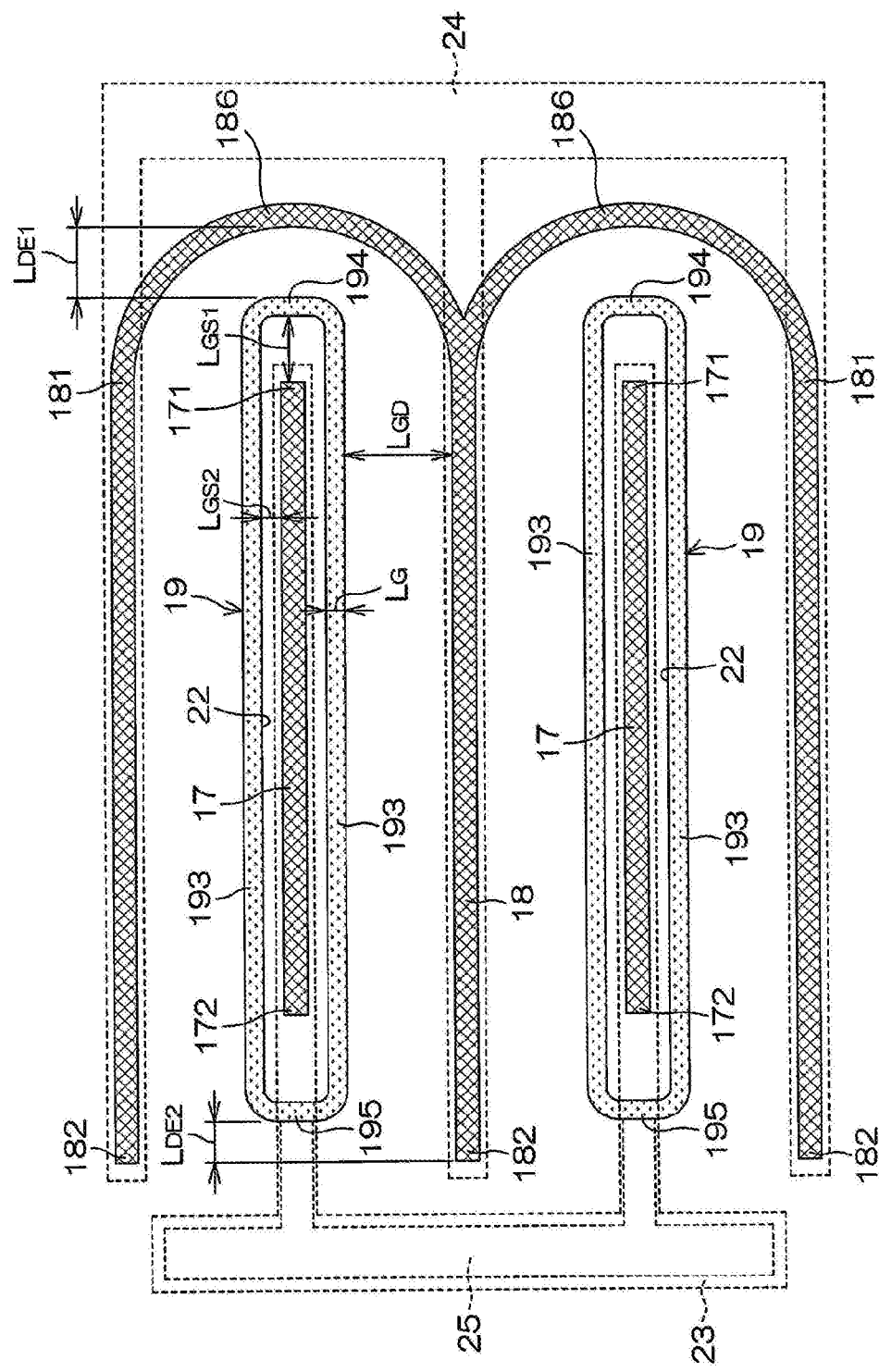
FIG. 14 is a view illustrating a planar layout (third form) of the electrodes of the nitride semiconductor device.

FIG. 14 is a view illustrating a planar layout (third form) of the electrodes 17 to 19 of the nitride semiconductor device 3.

In the nitride semiconductor device 3, the drain electrodes 18 between adjacent gate electrodes 19 may be connected to each other in at least one end portion thereof. For example, as illustrated in FIG. 14, the first end portions 181 of a plurality of drain electrodes 18 may be connected to each other by a connection portion 186 so as to be integrally formed. Thus, one end portion of the gate electrode 19 (the first connection portion 194 in FIG. 14) may be surrounded by the connection portion 186 of the drain electrode 18.

Also, with this configuration, similar to the first form and the second form described above, it is possible to reduce the electric field strength in the end portion (the connection portion 186) of the drain electrode 18.

FIG. 15 is a schematic cross-sectional view of a nitride semiconductor device 30 (Schottky barrier diode) according to an embodiment of the present disclosure. Hereinafter, the components different from those of the nitride semiconductor device 3 of FIG. 2 will be mainly described, the same reference numerals will be used for the common components, and a description thereof will be omitted.

The nitride semiconductor device 30 includes a field insulating film 31 formed on the electron supply layer 15. In addition, the nitride semiconductor device 30 may include an anode electrode 32 and a cathode electrode 33 connected to the electron supply layer 15 through contact holes 32a and 33a formed in the field insulating film 31, respectively.

Like the drain electrode 18 and the gate electrode 19 illustrated in FIGS. 3, 12, and 14, the anode electrode 32 and the cathode electrode 33 may be formed to have a finger shape in all or a portion thereof. The anode electrode 32 may form a Schottky junction with the electron supply layer 15 and the cathode electrode 33 may be in ohmic contact with the electron supply layer 15.

Also, the base part 5 of the terminal frame 2 may be integrated with a cathode terminal 34 connected to the cathode electrode 33. The anode electrode 32 is connected to an anode terminal 35 through the bonding wire 10. Further, a distance L between the anode electrode 32 and the cathode electrode 33 may range, for example, from 3 μm to 15 μm.

In the nitride semiconductor device 30, a predetermined voltage (e.g., 200 V to 600 V) making the cathode electrode 33 side positive is applied between the anode electrode 32 and the cathode electrode 33. In this state, the anode electrode 32 side is reversely biased and the 2D electron gas 20 below the anode electrode 32 is depleted to block a flow of current. Meanwhile, when a voltage making the anode electrode 32 side positive is applied, a current flows from the anode electrode 32 to the cathode electrode 33 through the 2D electron gas 20.

In the nitride semiconductor device 30, the aforementioned configuration of the drain electrode 18 may be employed in the cathode electrode 33.

That is, the cathode electrode 33 may be formed to be longer than the anode electrode 32 and at least a portion thereof may protrude relative to one end portion of the anode electrode 32, like the relationship between the drain electrode 18 and the gate electrode 19 of FIG. 3. Also, the cathode electrode 33 may surround all or one end portion of the anode electrode 32, like the relationship between the drain electrode 18 and the gate electrode 19 of FIGS. 12 and 14. By employing this configuration, it is possible to alleviate the electric field strength of the end portion of the cathode electrode 33, similar to the aforementioned first to third forms.

The embodiments of the present disclosure have been described above. The present disclosure may also be implemented in different forms.

For example, in the aforementioned embodiments, the example in which the electron transit layer 14 is formed of a GaN layer and the electron supply layer 15 is formed of AlGaN has been described. However, the Al compositions of the electron transit layer 14 and the electron supply layer 15 may be different or any other combinations may be applied. A combination of the electron supply layer and the electron transit layer may be any one of an AlGaN layer/a GaN layer, an AlGaN layer/an AlGaN layer (however, the Al compositions should be different), an AlInN layer/an AlGaN layer, an AlInN layer/a GaN layer, an AlN layer/a GaN layer, and an AlN layer/an AlGaN layer. More generally, the electron supply layer contains Al and N in the composition. The electron transit layer contains Ga and N in the composition, and an Al composition thereof is different from that of the electron supply layer. Since the Al compositions of the electron supply layer and the electron transit layer are different, lattice mismatch occurs therebetween, and thus, a carrier caused by the polarization contributes to the formation of a 2D electron gas.

Also, in the aforementioned embodiments, silicon is applied as a material example of the substrate 12, but in addition, a certain substrate material such as a sapphire substrate or a GaN substrate may also be applied.

Further, various design modifications may be made within the scope of the present disclosure described in the claims.

According to the present disclosure in some embodiments, it is possible to alleviate an electric field strength on the drain side or the cathode side during an off time. Thus, it is possible to enhance a dielectric breakdown strength of the device.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A nitride semiconductor device, comprising:
   a silicon substrate;
   a nitride semiconductor layer formed over the silicon substrate;
   a first gate electrode formed over the nitride semiconductor layer;
   a second gate electrode formed over the nitride semiconductor layer;
   a first finger electrode surrounded by a portion of the first gate electrode;
   a second finger electrode surrounded by a portion of the second gate electrode;
   a third finger electrode interposed between the first gate electrode and the second gate electrode, without being surrounded by any gate electrode, including the first gate electrode and the second gate electrode,
   wherein both ends of the first gate electrode protrude outward relative to both ends of the first finger electrode,
   wherein both ends of the second gate electrode protrude outward relative to both ends of the second finger electrode, and
   wherein both ends of the third finger electrode protrude outward relative to the both ends of the first gate electrode and the both ends of the second gate electrode.

2. The nitride semiconductor device of claim 1, wherein one end of the portion of the first gate electrode and one end of the portion of the second gate electrode are curved-shaped.

3. The nitride semiconductor device of claim 2, wherein the portion of the first gate electrode and the portion of the second gate electrode are the same width.

4. The nitride semiconductor device of claim 3, wherein the first finger electrode and the second finger electrode are the same width.

5. The nitride semiconductor device of claim 2, wherein the one end of the portion of the first gate electrode and the one end of the portion of the second gate electrode are disposed on a straight line which is parallel to a side line of the nitride semiconductor layer.

6. The nitride semiconductor device of claim 2, wherein one end portion of the first finger electrode, one end portion of the second finger electrode, and one end portion of the third finger electrode are disposed on a straight line.

7. The nitride semiconductor device of claim 1, wherein a distance between the third finger electrode and the portion of the first gate electrode is 3 μm to 15 μm.

8. The nitride semiconductor device of claim 1, wherein the portion of the first gate electrode is connected to the portion of the second gate electrode via a first leading portion and a second leading portion, wherein the first leading portion is parallel to the second leading portion.

9. The nitride semiconductor device of claim 1, further comprising:
    a connecting portion formed so as to connect the portion of the first gate electrode and the portion of the second gate electrode.

10. The nitride semiconductor device of claim 9, wherein the nitride semiconductor layer includes a first buffer layer formed over the silicon substrate, a second buffer layer formed over the first buffer layer, an electron transit layer formed over the second buffer layer, an electron supply layer formed over the electron transit layer, a first insulating layer formed over the electron supply layer, and a second insulating layer formed over the first insulating layer.

11. The nitride semiconductor device of claim 10, wherein the first buffer layer contains AlN, and the second buffer layer contains AlGaN.

12. The nitride semiconductor device of claim 10, wherein the electron transit layer contains GaN, and the electron supply layer contains AlGaN.

13. The nitride semiconductor device of claim 10, wherein the first insulating layer contains SiN.

14. The nitride semiconductor device of claim 11, wherein a thickness of the first buffer layer is about 0.2 μm.

15. The nitride semiconductor device of claim 11, wherein a thickness of the second buffer layer is about 0.2 μm.

16. The nitride semiconductor device of claim 12, wherein a thickness of the electron transit layer is about 0.5 μm.

17. The nitride semiconductor device of claim 12, wherein a thickness of the electron supply layer is about 5 nm to 30 nm.

18. The nitride semiconductor device of claim 8, wherein the third finger electrode protrudes relative to one end of the portion of the first gate electrode and one end of the portion of the second gate electrode, and
    wherein a protrusion amount of the third finger electrode relative to the one end of the portion of the first gate electrode and the one end of the portion of the second gate electrode is from 3 μm to 45 μm.

19. The nitride semiconductor device of claim 1, wherein the first finger electrode is entirely surrounded by the portion of the first gate electrode, and
    wherein the second finger electrode is entirely surrounded by the portion of the second gate electrode.

* * * * *